United States Patent [19]

Migliorini et al.

[11] Patent Number: 5,194,318
[45] Date of Patent: Mar. 16, 1993

[54] MULTILAYER FILM WITH METALLIZED SURFACE

[75] Inventors: Robert A. Migliorini; Eldridge M. Mount, III, both of Fairport, N.Y.

[73] Assignee: Mobil Oil Corporation, Fairfax, Va.

[21] Appl. No.: 782,855

[22] Filed: Oct. 25, 1991

[51] Int. Cl.$^5$ .................. B32B 15/08; B32B 27/08
[52] U.S. Cl. .................................... 428/215; 428/218; 428/461; 428/516
[58] Field of Search ............... 428/461, 215, 218, 516; 524/488

[56] References Cited

U.S. PATENT DOCUMENTS 4,345,005  8/1982  All et al. ..................... 428/461
4,870,122  9/1989  Lu .............................. 524/488

Primary Examiner—Thomas J. Herbert, Jr.
Attorney, Agent, or Firm—A. J. McKillop; C. J. Speciale; J. P. O'Sullivan

[57] ABSTRACT

A metallized oriented film combination having a propylene polymer substrate with a high density polyethylene skin layer on at least one side thereof and a thin metal layer deposited on the surface of the high density polyethylene.

5 Claims, No Drawings

MULTILAYER FILM WITH METALLIZED SURFACE

BACKGROUND OF THE INVENTION

This invention relates to a multi-layer film having a metallized surface having superior metal adhesion and excellent fracture resistance.

The bonding of metals such as aluminum, silver, chromium, etc. to plastic films has allowed such films to replace such metallic foils in many instances. The flexibility of the films necessitate the formation of a strong metal-plastic bond, and a number of approaches have been developed for providing such bonding.

In U.S. Pat. No. 4,345,005, the disclosure of which is incorporated herein by reference in its entirety, a homopolymer polypropylene core layer is co-extruded with an ethylene propylene copolymer. The film is biaxially oriented and the copolymer layer is corona treated. A metal coating is deposited on the corona treated layer by a suitable process such as vacuum deposition. In order to enhance adhesion between the metal and the plastic film neither the core layer, nor the outer layers contain a slip agent in an amount which would deleteriously affect the bond between the metal and plastic film.

Other approaches to providing a good metallizable surface have included modifying the surface of a polyolefin film with various oxidation processes and/or applying an adhesive to the surface of the film. Various primer coatings have been employed for this purpose, including carboxylated butadiene polymers and maleic anhydride modified static propylene polymers.

It is an object of the present invention to provide a multi-layer polymeric film having a metallized layer strongly bonded thereto. It is another object of the present invention to provide a metallized film having excellent metal fracture resistance. Yet another object of the invention is to provide a metallized film having low water vapor and oxygen transmission rates.

SUMMARY OF THE INVENTION

The present invention relates to a metallized oriented thermoplastic film combination comprising a propylene homopolymer or copolymer substrate (B) having a high density polyethylene skin layer (A) on at least one side thereof, said polyethylene having a thin metal layer deposited thereon. In a preferred form of the invention the structure includes a heat sealable polymer layer (C) on one side of substrate (B). It is preferred that the polymer layers are co-extruded.

DETAILED DESCRIPTION OF THE INVENTION

The propylene homopolymers contemplated by the present invention are from 80–100% isotactic and preferably from 95–96% isotatic polypropylene. They have a melt index ranging from about 2 to about 10 grams/10 minutes and preferably a melt index of from about 3.5–6 grams/10 minutes. Preferred propylene copolymers include 98-96/2-4 propylene/ethylene copolymers and a 50/50 propylene/butene-1 copolymer, a 95/5 propylene/1-pentene copolymer, a 90/10 propylene/1-hexene-copolymer, a 80-20 propylene/4-methyl-1-pentene copolymer, etc.

The contemplated high density polyethylene includes polyethylenes having a density of about 0.960 or greater. The high density polyethylene can be composed exclusively of a single high density polyethylene resin, a mixture of high density polyethylene resins or of high density polyethylene containing a minor proportion of about 10 wt.% microcrystalline wax. High density polypropylenes, as described in U.S. Pat. No. 4,870,122 issued to P.C. Lu, the disclosure of which is incorporated herein in its entirety, can be employed herein.

The heat sealable polymer (C) can be any layer or coating which will permit the film to be heat sealed to itself or heat sealed to some other surface The preferred heat sealable polymer is an ethylene propylene copolymer containing from about 2-4% by weight ethylene and from about 96% to about 98% by weight polypropylene The present invention also relates to a method of producing an oriented propylene homopolymer or copolymer base film for metallization which exhibits superior metal adhesion in comparison to other oriented base films. This is achieved by co-extruding the high density polyethylene skin layer onto the selected propylene homopolmyer or copolymer base and subsequently orienting the structure in the machine and transverse directions. Thereafter, the high density polyethylene surface is treated either by corona discharge treatment or by flame treatment. The corona discharge treatment can be to about 35-60 dynes/cm. and preferably to about 35-40 dynes/cm. Thereafter, the base film produced can be metallized by any known methods for example electroplating, sputtering and vacuum metallizing. A preferred method of metallizing the treated outer layer is by vacuum deposition. The metal coating can be any of the typical metals such as aluminum, copper, silver and chromium.

The metallized film produced exhibits excellent performance in conversion applications where a strong metal to base interface is critical. In adhesive and extrusion lamination applications, the metallized film exhibits superior bond strength and an absence of metal pick-off This is believed to be equal to or better than other quality metallized propylene polymer films produced by the prior art. For example, in extrusion lamination at typical process conditions, the metallized propylene polymer film exhibits metallized film to low density polyethylene bond strengths in excess of 200 g/in. with 0% metal transfer from the metallized propylene polymer to the low density polyethylene.

In addition, it has been found that the film can be made metal fracture resistant in extrusion lamination by down gauging the thickness of the high density polyethylene skin layer. More specifically, for a total film thickness of from about 50–100 gauge units, if the high density polyethylene skin thickness is less than or equal to about 2 gauge units, the metallized high density polyethylene surface will exhibit excellent metal fracture resistance when contacted with a low density polyethylene melt during extrusion lamination.

EXAMPLES

Various film constructions were produced which consisted of ABC type structures where total film thicknesses were held constant at 70 gauge. The C-layer represents the sealant side and was kept constant at 4 gauge units. High density polyethylene (Type 7835 by Cain Chemical-3.0 M.I, density 0.960) was co-extruded onto a polypropylene homopolymer B-layer to form the A-layer. The A-layer was varied in thickness from 1.0–3.0 gauge units. The high density polyethylene surface of the film was treated to an off-line level of 43 dynes/cm.

Films with 1.0–3.0 gauge units of high density polyethylene on the treated surface were vacuum metallized with aluminum, using conventional techniques, to an optical density of 1.8 to 2.5. To assess the degree of adhesion between the aluminum and the high density polyethylene A-layer for the films a 3M Company 610 tape test was performed on each film. The percentage of aluminum pulled off the surface of each metallized film after 3 consecutive pulls with the 610 tape was noted, and is reported below.

The metallized films were subsequently extrusion laminated to an oriented polypropylene slip film using a low density polyethylene (10 lb./ream) at a melt temperature of 620.F. The metallized coextruded films were measured for lamination bond strength to low density polyethylene and percent metal transfer from the metallized surface. Metal fracture was also inspected for each lamination with the light scope at 25X. Results of the evaluation are presented in the following Table. Also shown for comparison purposes are results typical of metallization directly on a treated polypropylene homopolymer layer.

| Examples | A-Layer Skin Thickness (Ga. Units) | % Pick-Off with 610 Tape | Metallized Aluminum LDPE Bond Strength (g/in.) | % OPP to Transfer to LDPE on Bond Pull | Aluminum Metal Fracture (25X) |
|---|---|---|---|---|---|
| 1 | 3.0 | 40 | 120 | 95 | None |
| 2 | 1.0 | 0 | 330 | 0 | None |
| 3 | 1.5 | 0 | 415 | 0 | None |
| 4 | 2.0 | 0 | 305 | 0 | None |
| 5 | 2.5 | 0 | 330 | 0 | Medium |
| 6 | 3.0 | 0 | 390 | 0 | Heavy |

As shown by the Table, 40% of the aluminum was picked off the treated polypropylene during the tape test. However, employing the treated high density polyethylene surface, no aluminum was picked-off. The Table shows the bond strength of the metallized oriented polypropylene to low density polyethylene to be 120 grams/in., which is significantly lower than the bond strength for Examples 2–6. The Table also reveals that using homopolymer polypropylene alone as the base for the aluminum, 95% of the aluminum transferred to the surface of the low density polyethylene. On the other hand, no aluminum transferred to the low density polyethylene for all of the Examples of the present invention. The final column of the Table shows that so long as the gauge thickness of the high density polyethylene is 2 gauge units or less, then no metal fracture occurs. When the gauge is greater than 2.5 the metal fracture ranges from medium to heavy.

The foregoing results show that the employment of a high density polyethylene surface on the propylene polymer base layer provides an outstanding surface for bonding a metallized layer thereto.

Although the present invention has been described with preferred embodiments, it is to be understood that modifications and variations may be resorted to, without departing from the spirit and scope of this invention as those skilled in the art will readily understand. Such variations and modifications are considered to be within the purview and scope of the appended claims.

What is claimed is:

1. A metallized oriented film combination comprising a propylene homopolymer or copolymer substrate (B) having a high density polyethylene skin layer (A) on at least one side thereof, said polyethylene having a thin metal layer deposited thereon, said polyethylene having a density of about 0.960 or greater, said total film thickness is from about 50 to about 150 gauge units and said polyethylene layer (A) is from about 3 gauge units or less.

2. The combination of claim 1 including a heat sealable polymer layer (C) on one side of substrate (B).

3. The combination of claim 2 wherein the polymer layers (A) (B) and (C) are co-extruded.

4. The combination of claim 3 wherein the metal layer is aluminum.

5. The combination of claim 4 wherein the film has aluminum deposited to an optical density of about 1.8 to about 2.5.

* * * * *